(12) United States Patent
Mei et al.

(10) Patent No.: US 11,380,845 B2
(45) Date of Patent: Jul. 5, 2022

(54) SEMICONDUCTING MICROFIBERS AND METHODS OF MAKING THE SAME

(71) Applicant: Purdue Research Foundation, West Lafayette, IN (US)

(72) Inventors: Jianguo Mei, West Lafayette, IN (US); Yan Zhao, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/177,207

(22) Filed: Oct. 31, 2018

(65) Prior Publication Data

US 2019/0157565 A1 May 23, 2019

Related U.S. Application Data

(60) Provisional application No. 62/580,106, filed on Nov. 1, 2017.

(51) Int. Cl.
| | |
|---|---|
| *H01L 51/00* | (2006.01) |
| *H01L 51/10* | (2006.01) |
| *H01L 51/05* | (2006.01) |

(52) U.S. Cl.
CPC ...... *H01L 51/0021* (2013.01); *H01L 51/0012* (2013.01); *H01L 51/0014* (2013.01);
(Continued)

(58) Field of Classification Search
CPC .................................................. H01L 51/0021
See application file for complete search history.

(56) References Cited

U.S. PATENT DOCUMENTS

| | | | |
|---|---|---|---|
| 9,365,013 B2* | 6/2016 | Fink | H04R 17/00 |
| 2018/0010266 A1* | 1/2018 | Li | D02G 3/367 |

OTHER PUBLICATIONS

Ong et al, Fabrication of polymer microfiber through direct drawing and splicing of silica microfiber via vapor spray and flame treatment, May 1, 2015, Applied Optics, vol. 54, No. 13, 3863-3867. (Year: 2015).*

(Continued)

*Primary Examiner* — Fernando L Toledo
*Assistant Examiner* — Valerie N Newton
(74) *Attorney, Agent, or Firm* — Purdue Research Foundation

(57) ABSTRACT

A method of making a semi-conducting microfiber. The method includes melting a semi-conducting solid polymer material to form a polymer melt, dipping a tip of a tool into the polymer melt, and lifting the tip of the tool away from the polymer melt, forming a microfiber. A semiconducting microfiber. The semiconducting microfiber contains a non-conjugated semiconducting polymer matrix containing crystalline aggregates with intentionally placed conjugation-break spacers along the polymer backbone. A device containing a plurality of semiconducting microfibers. Each of the semiconducting fibers contains a non-conjugated semiconducting polymer matrix containing crystalline aggregates with intentionally placed conjugation-break spacers along the polymer backbone. An apparatus to make a semiconducting microfiber. The apparatus contains a container to melt and hold the molten polymer, a tool dipped into the polymer melt, and a means of lifting tip of the tool away from a surface of the polymer melt forming a microfiber.

26 Claims, 17 Drawing Sheets

(52) U.S. Cl.
CPC ...... *H01L 51/0068* (2013.01); *H01L 51/0072* (2013.01); *H01L 51/0558* (2013.01); *H01L 51/0579* (2013.01); *H01L 51/105* (2013.01); *H01L 51/0036* (2013.01); *H01L 51/0043* (2013.01); *H01L 51/0053* (2013.01)

(56) References Cited

OTHER PUBLICATIONS

Zhao et al, Complimentary Semiconducting Polymer Blends for Efficient Charge Transport, Oct. 7, 2015, Chemistry of Materials, 7164-7170. (Year: 2015).*

Zhao et al, Continuous Melt-Drawing of Highly Aligned Flexible ans Stretchable Semiconducting Microfibers for Organic Electronics, Nov. 21, 2017, Advanced Functional Materials, 28, 1705584(1-9). (Year: 2017).*

Loke et al, Recent Progress and Perspectives of Thermally Drawn Multimaterial Fiber Electronics, Sep. 6, 2019, Advanced Materials, 1904911 pp. 1-30. (Year: 2019).*

\* cited by examiner

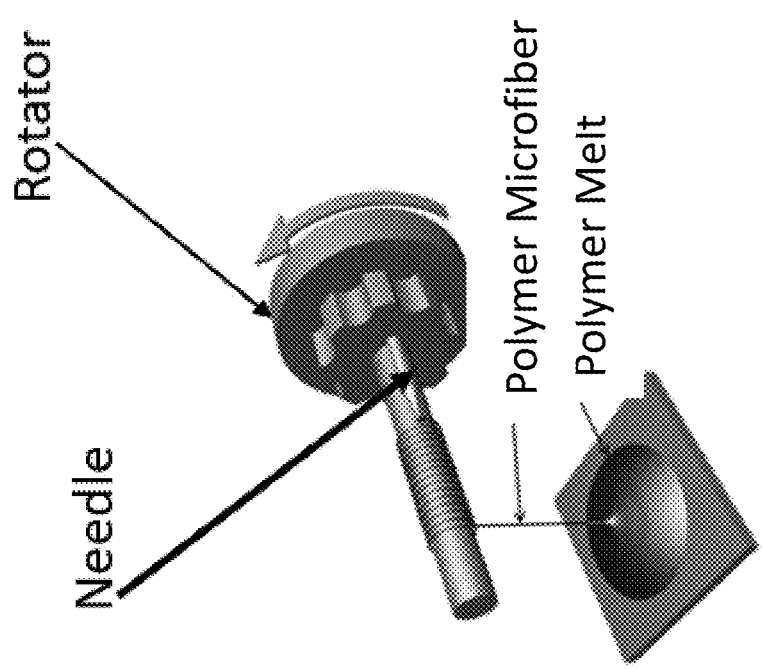

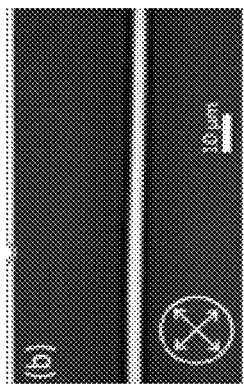
FIG. 2A
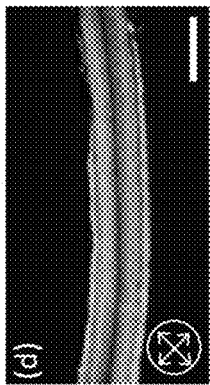
FIG. 2B
FIG. 2C
FIG. 2D
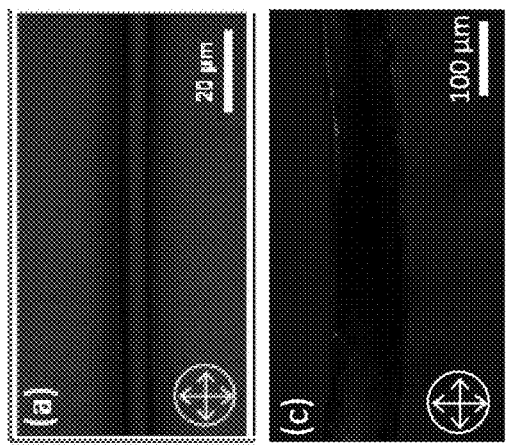
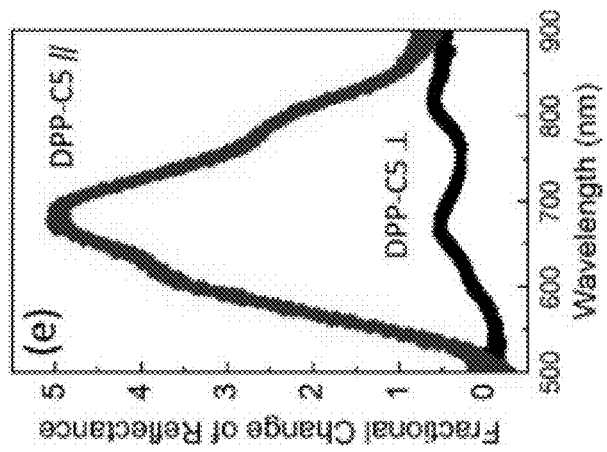
FIG. 2E

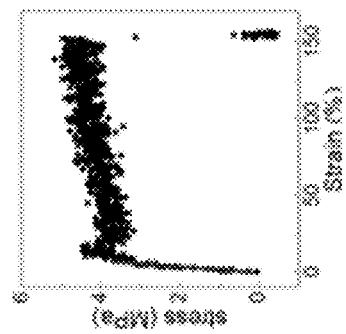
FIG. 3A
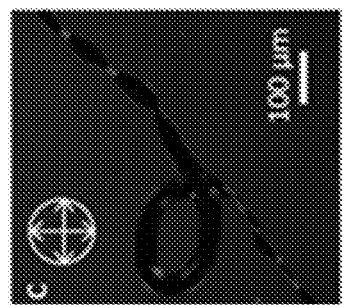
FIG. 3B
FIG. 3C
FIG. 3D
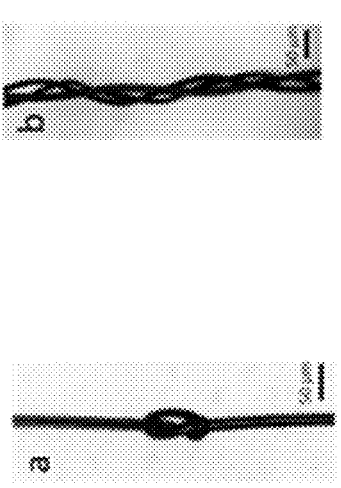
FIG. 3E
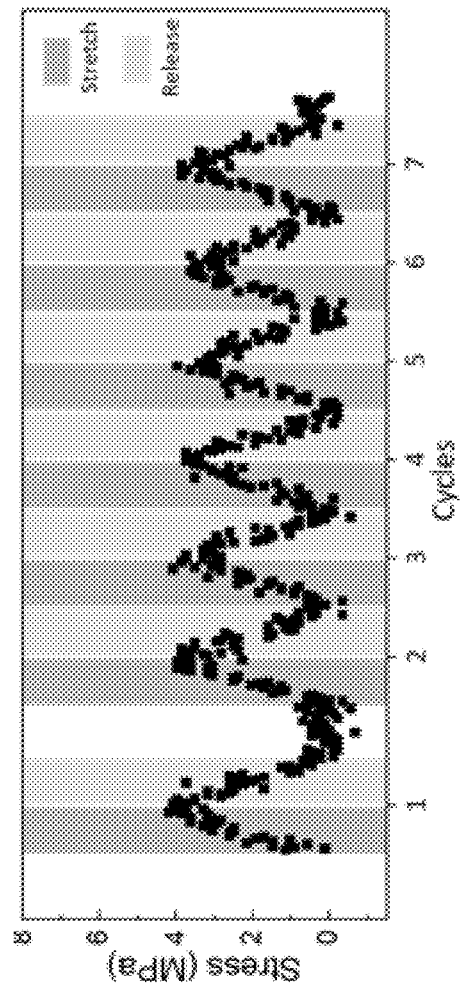

SEMICONDUCTING MICROFIBERS AND METHODS OF MAKING THE SAME

CROSS-REFERENCE TO RELATED APPLICATIONS

The present U.S. patent application is related to and claims the priority benefit of U.S. Provisional Patent Application Ser. No. 62/580,106, filed Nov. 1, 2017, the contents of which are hereby incorporated by reference in their entirety into the present disclosure.

STATEMENT REGARDING GOVERNMENT FUNDING

This invention was made with government support under N00014-16-1-2551 awarded by Office of Naval Research. The government has certain rights in the invention.

TECHNICAL FIELD

The present disclosure generally relates to semiconducting microfibers made from polymer melts, especially for use in organic electronics, and methods of making them.

BACKGROUND

This section introduces aspects that may help facilitate a better understanding of the disclosure. Accordingly, these statements are to be read in this light and are not to be understood as admissions about what is or is not prior art.

Semiconducting polymers, as a class of complementary and alternative materials to inorganic semiconductors such as silicon, attract a great deal of attention from the aspects of both fundamental and applied research. The intense interest lies in the facts that they hold great potential for future low-cost, light-weight, and flexible electronics. Semiconducting polymers are typically processed from organic solutions and presented in the form of thin films by various coating/printing techniques. Aside from solution-processed thin films, polymer micro-/nanofibers are also of great interest due to their high-aspect ratio, flexibility in surface functionalities, and superior mechanical performance. These features make semiconducting/conducting polymer micro-/nanofibers attractive for applications in flexible, stretchable and conformable electronics A variety of processing techniques have been known to prepare conventional polymer fibers, including electrospinning, melt drawing, template synthesis, phase separation, and self-assembly, etc. Of all the methods, electro spinning and melt-drawing are widely adopted for continuous mass manufacturing of polymer fibers. Millions of tons of polymer fibers (i.e. polyethylene and nylon) are produced annually. Although electrospinning and melt-drawing of insulating polymer fibers have been widely practiced, they have been hardly applicable to semiconducting polymers. Electrospun semiconducting polymer fibers are often discontinuous and contain lots of beads along the fibers, because semiconducting polymers usually have limited solubility and strong tendency to aggregate that can readily block the nozzles. As a result, semiconducting polymers are usually blended into other insulating polymers for electrospinning. These blended polymer micro-/nanofibers, unfortunately, share similar problems with solution-processed blended thin films (i.e. use of toxic solvents and uncontrolled morphologies), and in general exhibit poor electronic properties in comparison with pure semiconducting polymer thin films. On the other hand, plastic melt "drawing" and alignment have been well-documented for over 50 years.

Thus there exists an unmet need for scalable fabrication of semiconducting polymer fibers without the disadvantages of high melting temperatures and decomposition before melting.

SUMMARY

A method of making a semi-conducting microfiber is disclosed. The method includes melting a semi-conducting solid polymer material to form a polymer melt, dipping a tip of a tool into the polymer melt, and lifting the tip of the tool away from a surface of the polymer melt, wherein a microfiber is formed at the tip of the tool as the tip of the tool moves away from the surface of the polymer melt.

A semiconducting microfiber is disclosed. The semiconducting microfiber contains a non-conjugated semiconducting polymer matrix containing crystalline aggregates with intentionally placed conjugation-break spacers along the polymer backbone, and can optionally further include a fully conjugated semiconducting polymer wherein the fully conjugated semiconducting polymer serves as tie chains to bridge crystalline aggregates from the non-conjugated polymer matrix.

A device comprising a plurality of semiconducting microfibers is disclosed. In the device comprising a plurality of semiconducting microfibers each microfiber comprises a non-conjugated semiconducting polymer matrix containing crystalline aggregates with intentionally placed conjugation-break spacers along the polymer backbone. The device can optionally further contain a fully conjugated semiconducting polymer, wherein the fully conjugated semiconducting polymer serves as tie chains to bridge crystalline aggregates from the non-conjugated polymer matrix.

An apparatus to make a semiconducting microfiber is disclosed. The apparatus contains a container capable of melting a polymer forming a polymer melt and holding the polymer melt in a desired temperature range, a tool that can be dipped into the polymer melt, and a means of lifting tip of the tool away from a surface of the polymer melt forming a microfiber as the tip of the tool moves away from the surface of the polymer melt.

BRIEF DESCRIPTION OF THE FIGURES

FIG. 1B is a schematic illustration of melt-drawing apparatus and method of this disclosure using a rotator to collect the polymer microfibers.

FIGS. 2A and 2B are polarized optical microscope images for DPP-C5 polymer microfiber. (The orientation of the cross-polarizers for each image is shown on the bottom left.)

FIGS. 2C and 2D are polarized optical microscope images for DPP-C5 polymer ribbon. (The orientation of the cross-polarizers for each image is shown on the bottom left.)

FIG. 2E shows polarized micro-reflection spectroscopy for DPP-C5 ribbon.

FIGS. 2F and 2I 2D show GIXRD patterns for DPP-C5⊥ and DPP-C5// respectively.

FIGS. 3A, 3B and 3C show optical images for the flexible polymer microfibers/ribbons of this disclosure.

FIG. 3D shows engineering stress-strain plots for the polymer microfibers of this disclosure.

FIG. 3E shows cyclic stretch-release measurement of a representative polymer microfiber.

DETAILED DESCRIPTION

Figure 1A:
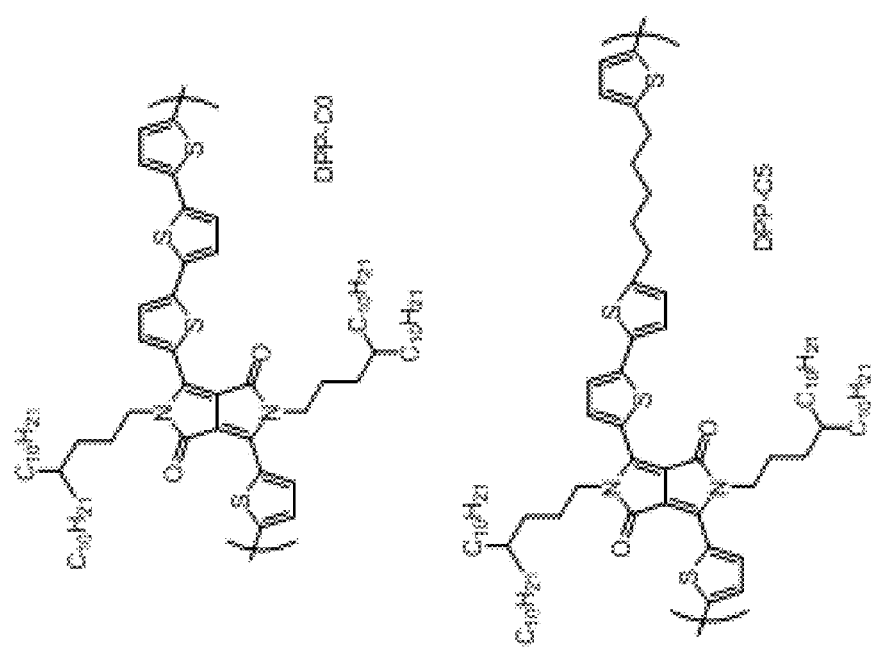
FIG. 1A shows chemical structure of DPP-C5 and DPP C0 used in this disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Melt-process able semiconducting polymers by introducing non-conjugated flexible linker (conjugation-break spacer, CBS) into the polymer main chain have been previously disclosed in U.S. patent application Ser. No. 15/164, 453 by Jianguo Mei and Yan Zhao titled Methods And Compositions For Enhancing Processability And Charge Transport Of Polymer Semiconductors and published as United States Patent Application Publication No. US 2016/ 0351814 A1 (published Dec. 1, 2016). The contents of this publication are hereby incorporated by reference in their entirety into this disclosure. FIG. 1A shows the structures and chemical make-up of two polymers designated as DPP-C5 and DPP-C0 in this disclosure. These polymers have been well described, for example, in U.S. patent application Ser. No. 15/164,453 by Jianguo Mei and Yan Zhao titled "Methods and Compositions for Enhancing Processability and Charge Transport of Polymer Semiconductors" and published in United States Patent Application Publication No. US 2016/0351814 A1 (published Dec. 1, 2016), whose contents, as noted above, are hereby incorporated by reference in their entirety into this disclosure. In the present disclosure, diketopyrrolopyrrole (DPP) polymer DPP-C5 and blends containing DPP-C5 and DPP-C0 were used to demonstrate manufacture semiconducting microfibers via a continuous melt-drawing process, and to study the impact of melt-drawing on polymer chain alignment. Further, in this disclosure, it has been demonstrated that highly uniform, meters-long polymer microfibers can be obtained from polymer melts. In general, in engineering field, aspect ratio (ratio of length to diameter) of fibers varies from a few tens to several thousand depending on the application. In the present disclosure, the term fiber is used for an aspect ratio a few tens to several tens of thousands. The term microfiber is used in this disclosure to denote fibers of a diameter less than 500 micrometers. The diameter of the polymer fibers can be tuned from sub-ten to hundred micrometers by controlling the processing temperatures and the drawing speeds. Cross-polarized optical microscope (c-POM) and polarized reflectance spectroscopy (PRS) experiments indicate the polymer microfibers are highly anisotropic and the polymer chains are aligned along the microfiber's long axis direction with dichroic ratios as high as ten, which is in good agreement with the grazing incidence X-ray diffraction (GIXRD) measurements. The polymer microfibers can be reversibly stretched before the yield point and can sustain up to 180% elongation without breaking. Furthermore, five DPP polymer derivatives have been designed and prepared in order to establish the relationship between molecular structure and mechanical properties. The results show that the CBS length has a big influence on the elastic property, while the side chain has more influence on the degree of elongation. It has been further demonstrated that flexible and stretchable conducting microfibers can be obtained with iron chloride doping of the polymers or polymer derivative. The doped polymers and/or polymer derivatives, were evaluated as stretchable organic conductors and source/drain electrodes in organic field-effect transistors.

Figure 2H:
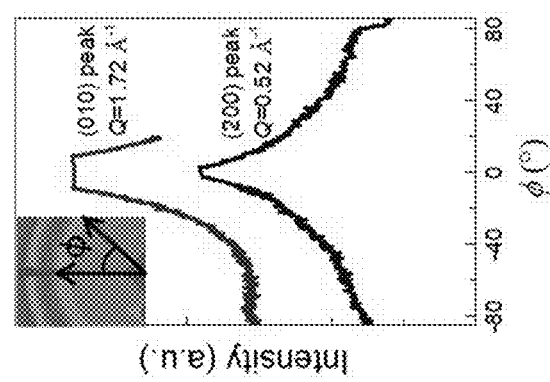
FIGS. 2H and 2K show the azimuthal linecut of the 2D data for DPP-C5⊥ and DPP-C5//, respectively.

FIG. 1B is a schematic illustration of melt-drawing method and apparatus of this disclosure using a rotator to collect the polymer microfibers. The solid polymer material was first put on a hot plate and melted at 170° C. After the polymer became fully liquefied, a needle tip was vertically dipped into the polymer melt, and gently pulled up. A fine polymer microfiber was formed immediately after the tip left the surface of polymer melt. The needle was then mounted onto a rotator as shown in FIG. 2B to collect the polymer microfiber continually. The diameters of polymer microfibers can be controlled by the selection of needle size, pulling speed and temperature. Small needle size, high temperature (low viscosity), and fast speed will result in thinner microfibers. It should be noted that the needle is just one example of a tool that can be used for the purpose. Thus, the needle is one embodiment of a tool that can be utilized to draw the melt from the polymer melt to form a microfiber.

Figure 1D:
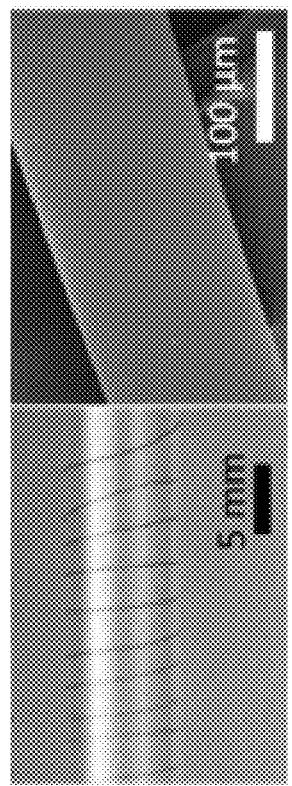
FIG. 1D shows an optical image (left part of the Figure, ~50 μm diameter and 40 cm long) and SEM image (right part of the Figure) of a single polymer microfiber of this disclosure.
Figure 1C:
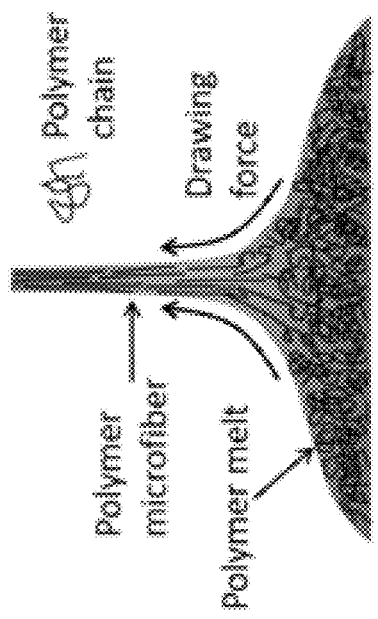
FIG. 1C is a schematic illustration of the polymer chain alignment during the melt-drawing process of this disclosure.

One example of the melt drawing process is described below: DPP-C0 (3.3 mg/mL) and DPP-C5 (10 mg/mL) were dissolved separately in dichlorobenzene at 50° C. stirred overnight in separate containers. DPP-C5 solid material (~10 mg) was placed onto silicon or glass substrate on a hot plate inside nitrogen filled glovebox. The temperatures used for melt-drawing are 160-180° C. for DPP-C5. After the material got fully liquefied, a needle was used to draw some material out from polymer melt surface and further drew out the long polymer microfiber continuously at different speed. With very fast speed (~50 cm/s), thin microfiber (5-10 μm) can be obtained. The very thick microfiber up to 250 μm was fabricated by slow speed (~1 cm/s) and a bigger needle. In the experiments leading to this disclosure, a 31 gauge (known to those skilled din the art) was used for making microfibers with diameters up to 100 micrometers, while a thicker 21 gauge needle was used for microfibers of greater diameter up to 250 micrometers. Through selection of the processing conditions, polymer microfibers with diameters from 5 μm to 250 μm were obtained. FIG. 1C is a schematic illustration of the polymer chain alignment during the melt-drawing process of this disclosure. Meters-long polymer microfiber was readily fabricated, and showed smooth surface as shown by the scanning electron microscope (SEM) image. FIG. 1D shows an optical image (left part of the FIG. 1D, ~50 μm diameter and 40 cm long) and an SEM image (right part of the Figure) of a single polymer microfiber of this disclosure. The melt-drawing process of this disclosure can be practiced in a laboratory and is scalable for mass production of semiconducting polymer microfibers.

Optical study of the polymer microfibers: Optical microscopy was used to qualitatively characterize the crystallinity and chain alignment of the polymer microfibers via cross-polarized optical microscopy (c-POM). Polymer microfibers with 5-10 μm in diameter and polymer ribbons with 1-2 μm in thickness (fabricated from polymer fibers via pressing) were chosen for the investigation. The c-POM images are displayed in FIG. 2a-d. Optical birefringence provides a qualitative measure of the extent of global polymer chains alignment in the fibers/ribbons. When the polymer microfibers or ribbons were rotated between the crossed polarizers, the samples switched between dark and bright every 45 degrees (see the supplementary video). This optical contrast is originated from birefringence. FIGS. 2A and 2B show polarized optical microscope images for DPP-C5 polymer microfiber. (The orientation of the cross-polarizers for each image is shown on the bottom left.). Referring to FIGS. 2A and 2B, with nearly 10 μm in diameter, the DPP-C5 microfiber shows a distinct optical contrast. A total light extinction is observed when the microfiber/ribbon is aligned with either axis of the cross-polarizers, which indicates that the polymer chains are oriented either parallel or perpendicular to the microfiber's long axis direction. It is worth mentioning that the polymer microfibers/ribbons exhibit a uniform color and optical contrast up to centimeter range scale under cross-polarized light. This suggests that a long range ordering is persistent along the polymer microfibers. FIGS. 2C and 2D are polarized optical microscope images for DPP-C5 polymer ribbon. (The orientation of the cross-polarizers for each image is shown on the bottom left.). FIG. 2E shows polarized micro-reflection spectroscopy for DPP-C5 ribbon. {please write a sentence describing what FIGS. 2C, 2D and 2E are saying . . . }

Polarized micro-reflection spectroscopy (PRS) was further chosen for a quantitative analysis. The differential reflectance (δR) is used here as shown in FIG. 2E to quantify the polymer chain alignment. The signs "∥" and "⊥" in FIG. 2E denote the orientation of the polymer microfiber/ribbon to the axis of the polarizer. The differential reflectance (δR) is defined as:

$$\delta_R = \frac{R_{sample} - R_{substrate}}{R_{substrate}} \quad (1)$$

where Rsample is the reflectance intensity of sample with substrate and Rsubstrate is the, reflectance intensity of bare substrate. For thin film on transparent substrate, the differential reflection is directly related to the absorption coefficient by the following equation (2):

$$\delta_R = \frac{4}{n_{sub}^2 - 1} A \quad (2)$$

where $n_{sub}^{-1}$ is the refractive index of substrate and A is the absorption coefficient. According to Equation 2, the differential reflectance is proportional to the absorbance of sample on substrate. For polarized absorbance, the maximum absorption is expected when the transition dipole moments (TDM) align with the polarizer axis, and for DPP based semiconducting polymers, TDMs are usually oriented parallel to the polymer backbone. For DPP-C5 polymer ribbon, the maximum differential reflectance is observed with polymer ribbon parallel to the polarizer axis, which confirms that the polymer chain is oriented parallel to the microfiber long axis direction in agreement with the c-POM results. The degree of polymer chains alignment was further quantified by the dichroic ratio of the peak around 680 nm, using the equation R=I∥/I⊥, where R is the dichroic ratio and I is the spectrum intensity. The dichroic ratio of DPP-C5 polymer microfiber is 9.6, which is in par with those highly crystalline organic semiconducting films. 2D order parameter S is also used to quantify the degree of orientation. The S value can be calculated by the optical dichroic ratio using the following equation:

$$S = \frac{R-1}{R+1} = \frac{I_\parallel - I_\perp}{I_\parallel + I_\perp} \quad (3)$$

S corresponds to the percentage difference between absorption peak intensities perpendicular and parallel to the alignment direction. For instance, a complete alignment S is equal to unity, whereas for amorphous/disordered material S approaches zero. The calculated S for DPP-C5 is 0.81. It suggests that DPP-C5 polymer chains are highly aligned parallel to the microfiber long axis direction. The degree of the alignment is similar with some of the best-known polymers. Both dichroic ratio R and 2D order parameter S measurements show that the DPP-C5 polymer chains are highly alignment in the microfibers.

Figure 2F:
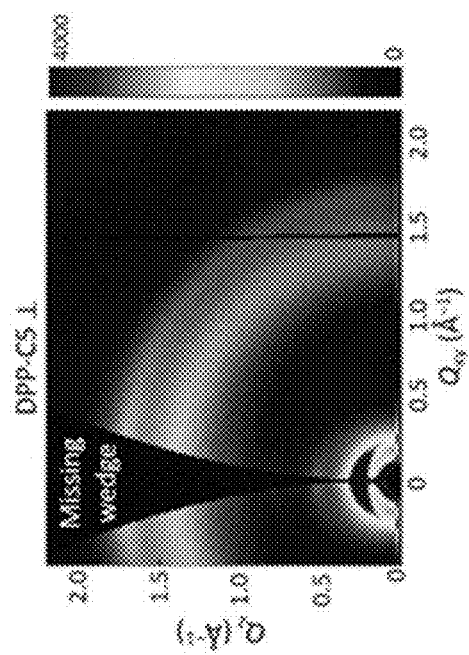
Figure 2G:
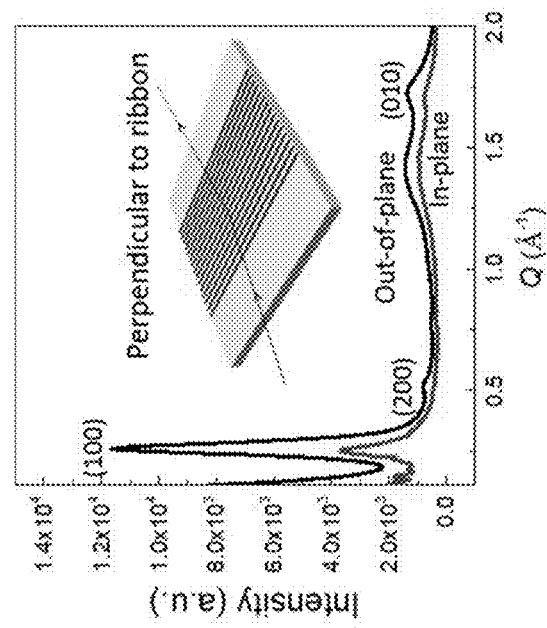
FIGS. 2G and 2J are show 1D GIXRD plots obtained from 2D data for DPP-C5⊥, DPP-C5//, respectively.
Figure 2I:
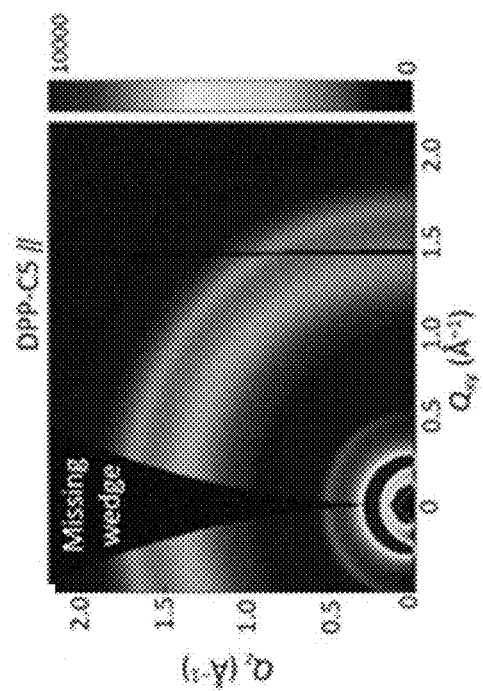

Morphological study of the polymer microfibers: To probe the molecular packing and the origin of anisotropic properties of these melt-drawn polymer microfibers, two-dimensional GIXRD measurement was employed. The single polymer microfiber GIXRD is ideal to study molecular packing, but due to the tiny size of the fibers, it is hard to align the fiber to the X-ray beam and the GIXRD signal is very weak. Therefore, multiple fibers were used for GIXRD measurement, and the microfibers were pressed into ribbons to avoid measurement complication from the smooth and round microfiber surface. The polymer ribbons were pre-aligned on a 1.5×1.5 cm SiO2/Si substrate and the X-ray beam was applied either perpendicular or parallel to the same sample with incident angle of 0.14°. The GIXRD patterns are shown in FIGS. 2F and 2I. Clear lamellar packing and π-π packing peaks are observed. The calculated packing distances are 24.02 Å for lamellar packing, and 3.64 Å for π-π packing. The peak at Q vector around 1.4 Å−1 is the amorphous peak, which is commonly observed in conjugated polymers. Compared with the thin film packing results in our previous studies, the packing distances in polymer microfibers changed slightly. The lamellar packing distance of DPP-C5 polymer chain is slightly increased from 23.3 Å (thin film) to 24.0 Å (microfiber), and the π-π packing distances of polymer microfibers, on the other hand, are decreased from 3.70 Å (thin film) to 3.64 Å (microfiber). This result suggests that the melt-drawing process results in closer π-π packing distances and larger lamellar distances. It has been previously observed that in molecular organic semiconductors the π-π packing distances can be tuned via solution shearing force. It is reasonable to believe that the extensional flow along the microfiber direction exerts an influence on the polymer chain packing during the melt-drawing process.

Figure 2K:
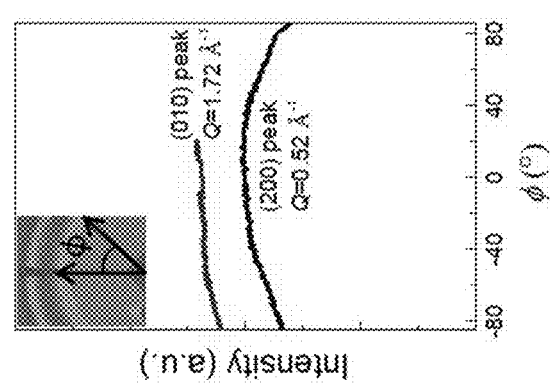
Figure 2J:
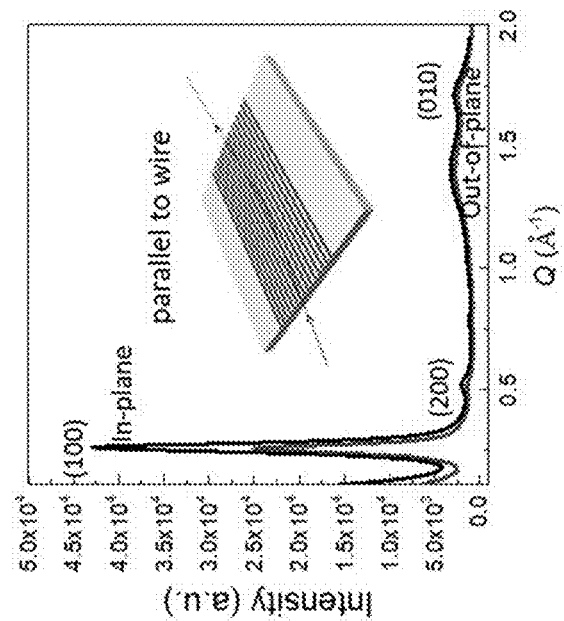
Figure 2L:
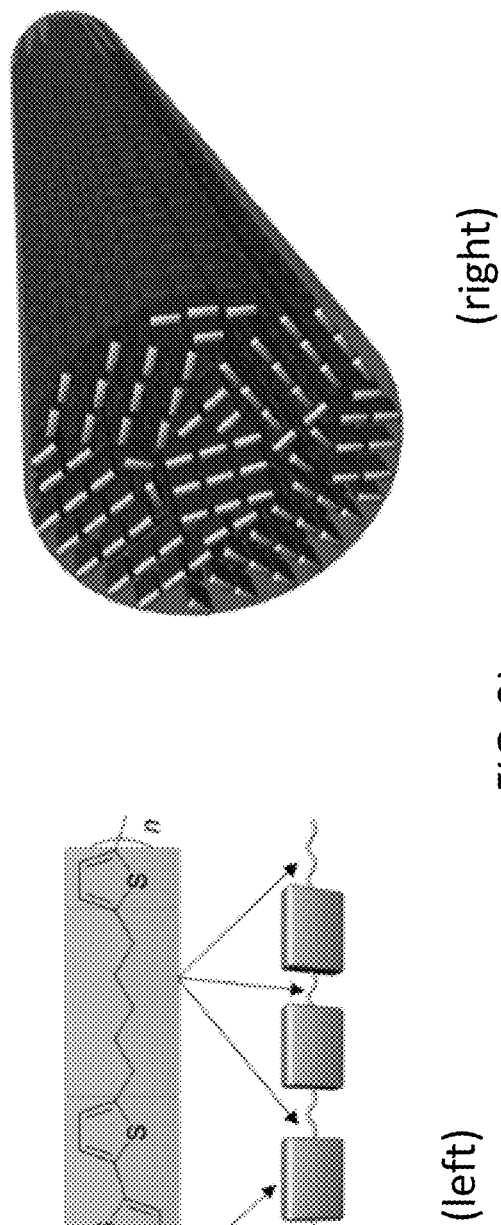
FIG. 2L is a schematic illustration of the polymer chains (designated as "left" in the figure) and the chain packing in polymer microfibers (designated as "right" in the figure).

For conjugated polymers, the lamellar packing, π-π packing and polymer chains are orthogonal to each other. In this polymer microfiber, the polymer chains are aligned along the microfiber long axis. Therefore, when the X-ray beam is applied perpendicular to the ribbons/polymer chains, both lamellar packing and π-π packing peaks are expected to only appear along the out-of-plane direction. FIG. 2F shows the DPP-C5⊥ GIXRD pattern and the result agrees with the expected. 1D GIXRD linecuts (A line cut is a 1D plot obtained from the 2D data at a specific area) for both in-plane and out-of-plane directions are plotted in FIG. 2G, and the out-of-plane peak intensities are much stronger than the in-plane intensities. Azimuthal linecut of the lamellar packing and π-π packing peaks is also performed (FIG. 2H) to examine the peak intensity changes as function of azimuthal angle φ. The missing data at φ around 0° results from the fact that the true qz axis is not probed. For the analysis of lamellar packing, (200) peak (Q~0.52 Å−1) was chosen, instead of (100 peak). Because the (100) peak is too close to the direct X-ray beam, and is thus compounded by the influence of the beam itself. From FIG. 2H, it becomes clear that both (200) and (010) peak intensities are strong along the out-of-plane direction (φ close to 0°), and are very weak along in-plane direction (φ close to ±90°). Both 1D and azimuthal linecut clearly show that both lamellar packing and π-π packing peaks tend to appear in the out-of-plane direction. This once again confirmed the polymer chain alignment along the long axis of the microfibers. For the X-ray parallel to microfibers/ribbons, very uniform diffraction rings were observed for both single microfiber (Figure S5 of Appendix A) and multiple ribbons (FIG. 2I). These uniform diffraction rings indicate that although the polymer chains are aligned along the polymer microfiber, there is no preferred orientation for π-π and lamellar packing. Therefore, no anisotropic property can be observed from the GIXRD pattern, and thus lead to very similar in-plane and out-of-plane 1D GIXRD curves (FIG. 2J). Accordingly, azimuthal linecuts are relatively flat at all y angle (FIG. 2K). The proposed packing mode of DPP-C5 polymer chain is shown in FIG. 2L.

Electrical properties of the polymer microfibers: Confirmed by the c-POM, PRS and GIXRD measurements, polymer chains are highly aligned along the microfiber's long axis direction, and their π-π stacking is randomly oriented in the plane perpendicular to the microfiber's long axis (as shown in FIG. 2L). Organic field-effect transistors (OFETs) were then fabricated to study the charge transport properties resulting from this uniaxial chain alignment in the polymer microfiber. Devices with microfiber both parallel and perpendicular to the current direction were fabricated and measured. Experimental details about device size, fabrication and measurement can be found in the supporting information. More than 10 devices were fabricated for each measurement and their maximum and average charge carriers mobilities were measured. The direction signs "∥" and "⊥" can be used to represent the angle between polymer microfiber (polymer chains) and the channel direction (source/drain current direction). The sign "∥" (parallel) means the angle between polymer microfiber (polymer chains) and the channel direction (source/drain current direction) is zero. The sign "⊥" (perpendicular) means the angle between polymer microfiber (polymer chains) and the channel direction (source/drain current direction) is 90°. A few observations were made as follows: 1) DPP-C5⊥ OFETs exhibit a unusally large variation when it comes to charge carrier mobility. 2) DPP-C5⊥ gives a maximum mobility of 0.012 cm2/Vs, which is nearly ten folds of the maximum mobility that DPP-C5∥OFETs present (0.0016 cm2/Vs). 3), the maximum mobility of DPP-C5⊥ device is even higher than their spin-coated thin film device.

For DPP-C5 polymer, the intra-chain charge transport is interrupted by the non-conjugated CBS. Therefore, transport along the π-π packing direction is the only efficient way. This explains why the DPP-C5⊥ devices have better performance than DPP-C5∥ because the DPP-C5∥ devices lack this efficient charge transport pathway. In addition, the DPP-C5 molecules are not all edge-on oriented because the π-π stacking in the microfiber is randomly orientated. Therefore, the charge transport is not that efficient in some face-on oriented areas. But for the area with edge-on oriented DPP-C5 molecules, the closer π-π stacking distance and good orientation are all favored for charge transporting. This explains the large variation of DPP-C5⊥ OFETs observed and why the maximum mobility of DPP-C5⊥ devices is better than that of the thin film OFETs. Another possible reason for the large variation of the device performance might from the contact problem. The big size of the microfiber might cause some air gap/bad contact. The measured performances from these devices are underestimated.

Mechanical properties of the polymer microfibers: Flexibility and stretchability are unique features for polymeric semiconductors, which make them especially attractive for soft and conformable/deformable wearable electronics. To evaluate the mechanical properties of the DPP-C5 polymer microfibers, a series of experiments were performed. FIG. 3A shows a small knot made from an individual polymer microfiber. The radius of curvature is around 30 μm with microfiber diameter around 20 μm. FIG. 3B shows a knitted architecture from three individual microfibers. A pressed and twisted microribbon under cross-polarized microscopy is also shown in FIG. 3C. All three experiments demonstrate the excellent flexibility of the melt-drawn polymer microfibers qualitatively.

The stretchability of polymer microfibers was quantitatively assessed by the stress-strain test with a force gauge and a motorized linear stage. The engineering stress-strain plot is shown in FIG. 3D. The initial slope of the stress-strain curve gives a measure of the modulus. It is estimated that the tensile modulus of DPP-C5 polymer microfibers are 0.084±0.021 GPa and the yield point is 9.9±1.5% strain. The polymer microfibers exhibit a reversible deformation before the yield point (see FIG. 3E), behaving in an elastic manner. Once stress is removed, the polymer microfibers return to their original shape. The polymer microfibers continue to deform considerably under stress, as revealed by the plateau in the stress-strain curve. In this region, the deformation becomes permanent and the recovery is only partial. The polymer microfibers show an ultimate elongation up to 180% before breaking (FIG. 3D of this disclosure) with an average fracture strain of 109±31%. FIG. 3E shows cyclic stretch-release measurement of a representative polymer microfiber.

Figure 3F:
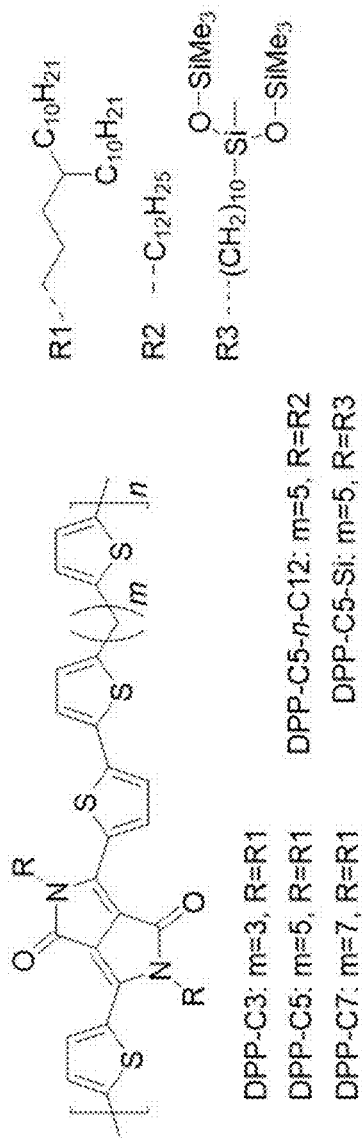
FIG. 3F shows chemical structure of the polymers used for the mechanical study of this disclosure.
Figure 3H:
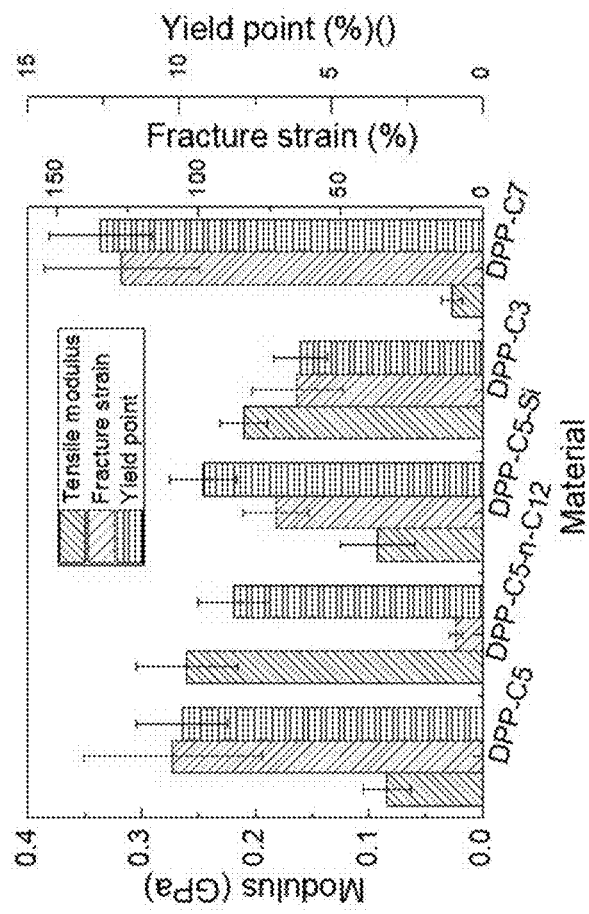
FIG. 3H shows the tensile moduli, fracture strains, and yield points calculated from the stress-strain curves for different polymer microfibers of this disclosure.
Figure 3G:
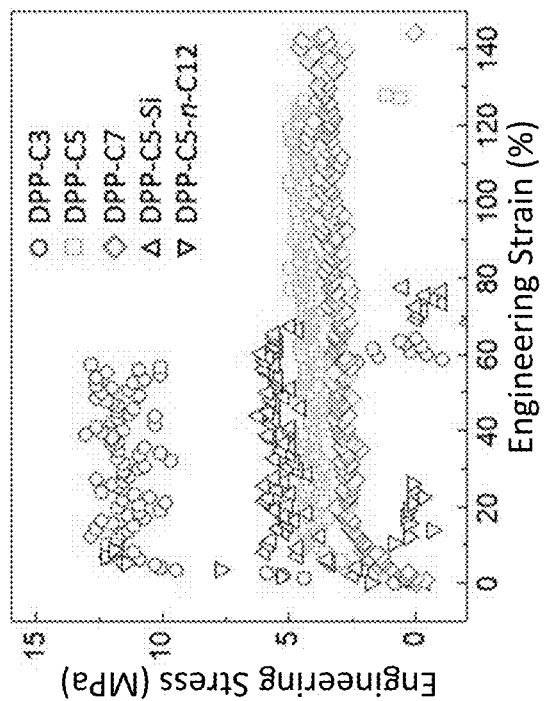
FIG. 3G shows engineering stress-strain curves for different polymer microfibers of this disclosure. why are x and y labels not stress and strain.

Although some stretchable semiconducting polymers have been reported, most of them are supported by stretchable substrates, usually polydimethylsiloxane (PDMS). It has been reported that fully conjugated DPP polymer thin films have relatively low stretchability. With conjugation break spacer (CBS), DPP-C5 exhibits much better stretchability. How the change of chemical structure influences the mechanical properties becomes an interesting question for designing flexible and stretchable semiconducting polymers. FIG. 3F shows chemical structure of several polymers used for the mechanical study of this disclosure. These DPP derivatives with different conjugation break spacers and side chains were studied here for this purpose. FIG. 3G shows engineering stress-strain curves for different polymer microfibers of this disclosure. FIG. 3H shows the tensile moduli, fracture strains, and yield points calculated from the stress-strain curves for different polymer microfibers of this disclosure. Referring to FIG. 3H, compared with DPP-C5, DPP-C3 with the same side chain but shorter CBS exhibits higher modulus (0.21±0.020 Gpa), lower yield point (6.0±0.9% strain) and smaller fracture strain (65±16%). On the other hand, with longer CBS, DPP-C7 exhibits lower modulus (0.027±0.0091 Gpa), higher yield point (12.6±1.7% strain) and longer fracture strain (127±27%). Side chains are shown to influence the mechanical properties. With siloxane-terminated side chains, DPP-C5-Si exhibits comparable modulus (0.09±0.033 GPa) and yield point (9.2±1.1%) with DPP-C5, and slightly smaller fracture strain (72.6±11.5%). However, with same CBS but linear C12 as side chain, DPP-C5-n-C12 exhibits very poor stretchability (9.7±2.4%), although the yield point (8.2±1.2%) is not changed much.

From the results described above, the CBS length has a large influence on the yield point, and the side chain has more influence on the fiber elongation. Comparing DPP-C3, DPP-C5 and DPP-C7, the only difference in molecular structure is the CBS length. Their yield point increased from 6.0%, 9.9% to 12.6%, respectively. On the other hand, with same CBS length but different side chains, DPP-C5, DPP-C5-Si and DPP-C5-n-C12 exhibit similar yield points all around 9%. One possible explanation for these results is that the elastic property (related to the yield point) originates from the flexible non-conjugated CBS, and longer CBS gives higher yield point. These observations indicate that the side chains have limited influence on the yield point, but play an important role in elongation property. DPP-C5-n-C12 with short linear side chain exhibits distinctly different elongation property from all other polymers. The 9.7±2.4% fracture strain is much lower than DPP-C5 and DPP-C5-Si. With siloxane-terminated side chains, DPP-C5-Si has much better elongation property, but still not as good as DPP-C5 with long branched side chains. This result indicates that the longer and branched side chain is favored for elongation property. It is understood that the chemical structure also affects the molecular packing and glass transition temperature Tg, and they both have influence on mechanical properties of the fiber. However, from current results, it is understood that both CBS and side chain can be used to tune the stretchability of semiconducting polymers.

Figure 4B:
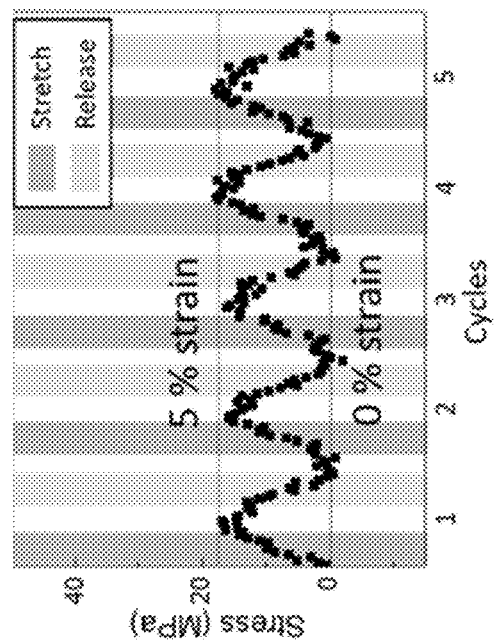
FIG. 4B shows the cyclic stretch-release measurement of a representative doped DPP-C5 polymer microfiber.
Figure 4A:
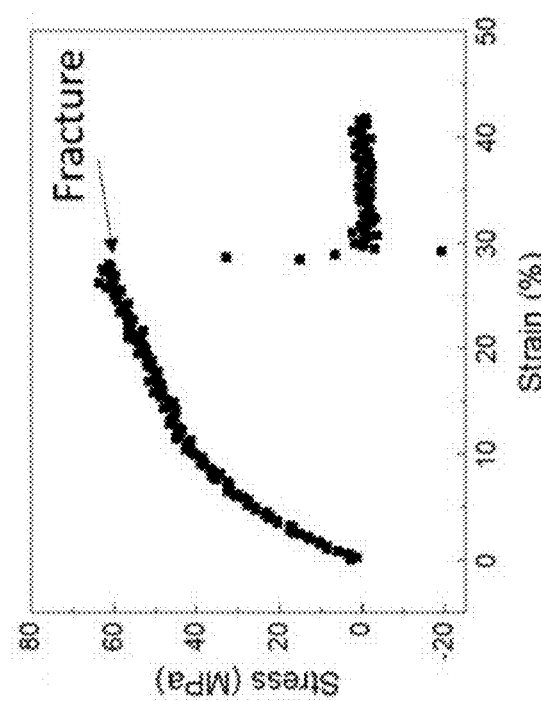
FIG. 4A shows the stress-strain curve of a representative doped DPP-C5 polymer microfiber.
Figure 4C:
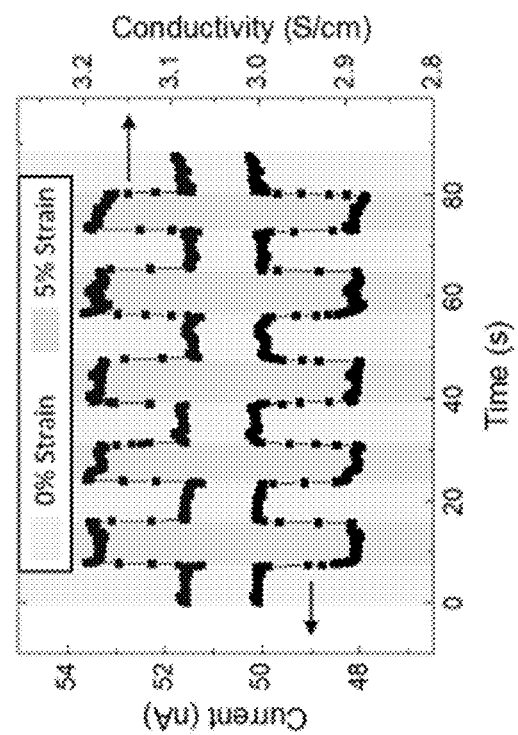
FIG. 4C shows the current and conductivity as function of strain for a representative doped DPP-C5 polymer microfiber.
Figure 4D:
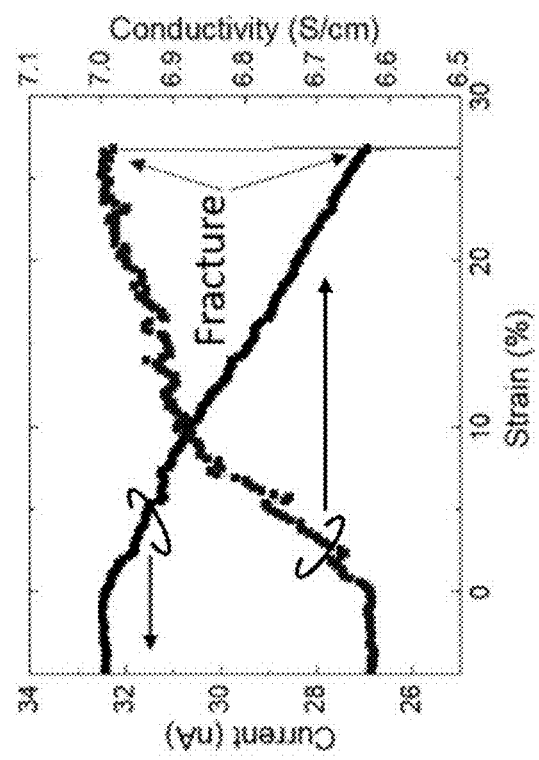
FIG. 4D shows conductivity measurement in stretch-release cycles for a representative doped DPP-C5 polymer microfiber.
Figure 4F:
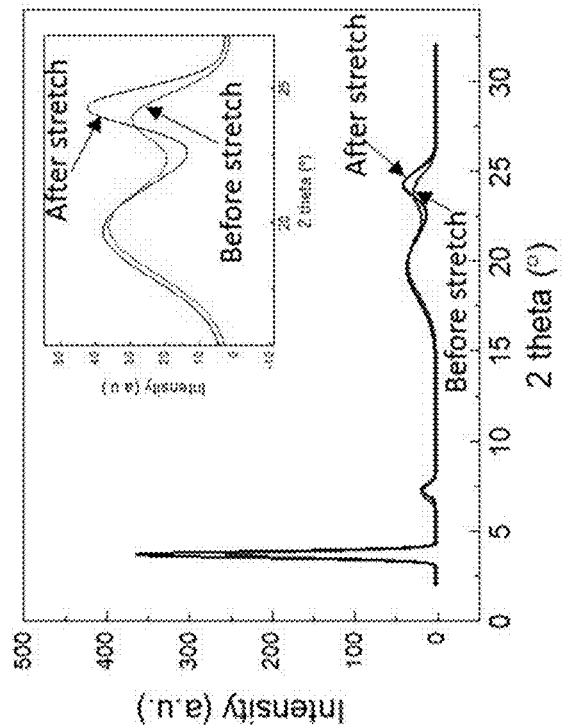
FIG. 4F shows Gauss fitting of the XRD data of FIG. 4E
Figure 4E:
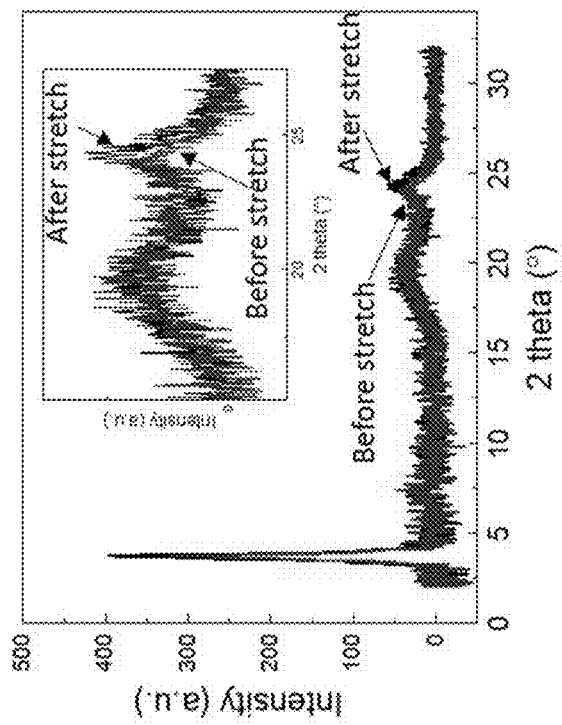
FIG. 4E shows XRD measurement of DPP-C5 microfiber before and after stretching Inset show the π-π peak area.

Electrical and mechanical properties of the doped polymer microfibers: The observations of low tensile moduli, high elasticity and high elongation for DPP-C5 microfibers suggest that these microfibers hold great potential for soft and conformable/deformable electronics (e.g. smart textiles). Therefore, the DPP-C5 polymer microfibers were further doped by $FeCl_3$ to study the electrical and mechanical properties for flexible electronics. The DPP-C5 polymer microfiber was doped in $FeCl_3$ nitromethane solution (100 mg/mL) for 1 hour and dried in vacuum before use. The conductivity of doped DPP-C5 polymer microfiber was measured by both two-probe and four-probe methods. Both methods gave similar results and the average conductivity was 6.2 S/cm. The mechanical properties of the polymer microfibers of this disclosure are also measured and shown in FIGS. 4A and 4B. Referring to FIGS. 4 A and 4B, it can be seen that compared with pure DPP-C5 microfiber, the doped DPP-C5 microfiber exhibits much higher modulus (0.67±0.047 GPa). In addition, instead of reaching a plateau, the stress keeps increasing after the yield point, and the fracture strain is 35.5±10.2%. Although the elongation property of DPP-C5 microfiber decreased after doping, elastic behavior was also observed as shown in cyclic stretch-release measurement (FIG. 4B) and the yield point is still around 10% strain. To evaluate the change in conducting behavior under strain, bias voltage was applied and current was measured on the doped microfiber while stretching. The current-strain curve in FIG. 4C shows that the current decreased by stretching the doped microfiber. This is explained by the fact the length of the microfiber increased and cross-section area decreased through stretching the polymer microfiber. Both increased length and decreased cross-section area lead to higher resistance, resulting in a smaller current. Interestingly, the estimated conductivity increased as the strain increased. The increase in conductivity is likely resulted from the molecular packing enhancement by the external flow force from stretching. XRD measurement was carried out on single DPP-C5 microfiber before and after stretching (20% strain, FIGS. 4E and 4F of this description). The results show that after stretching, the lamellar packing and amorphous peaks positions are almost unchanged, but the π-π packing peak moves to higher two-theta direction, which indicates closer packing distance. The calculated π-π packing distance decreased from 3.71 Å (before) to 3.66 Å (after). This is in good agreement with the GIXRD results discussed above, where a closer π-π packing is resulted from the external flow. In addition, the full width at half maximum (FWHM) of the π-π packing peaks decreased after stretching, indicating higher ordering. All these observations show that the stretching of polymer microfiber lead to more ordered molecular packing and closer π-π stacking. It is reasonable to believe that better molecular packing lead to better charge transporting, and higher conductivity.

With the conductivity and stretchability exhibited as shown above, the polymer microfibers of this disclosure are potential candidates for stretchable electronics. FIG. 5A shows a LED bulb lit us using microfibers made of DPP-C5. As shown in FIG. 5A, the 100 μm thick doped DPP-C5 fiber can light up a LED bulb. When the polymer microfibers were stretched from their original length (18.51 mm) to 23.17 mm (25% strain), the brightness change of the LED bulb was negligible. The brightness started to decrease rapidly until the microfibers were stretched to 27.43 mm (48% strain), where the microfibers started to break. However, the LED bulb was still on until all microfibers were fractured. This experiment demonstrates the utility of polymer microfibers as stretchable conducting microwires.

Figure 5B:
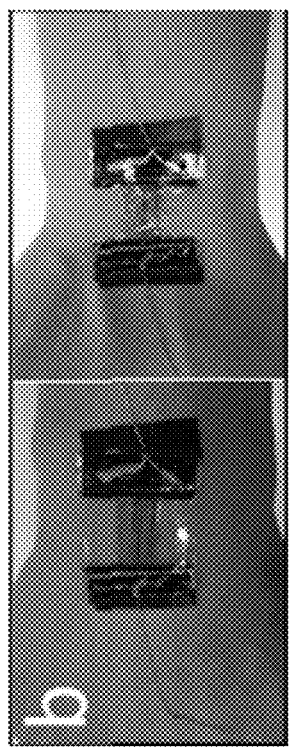
FIG. 5B shows that DPP-C5 microfibers as conducting materials function well with wrist extension and flexion.
Figure 5A:
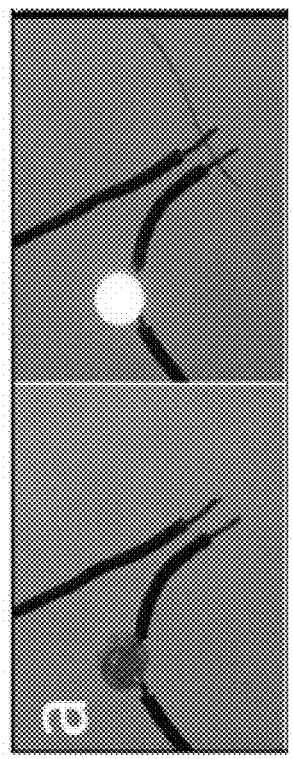
FIG. 5A shows a LED bulb lit us using microfibers made of DPP-C5.
Figure 5C:
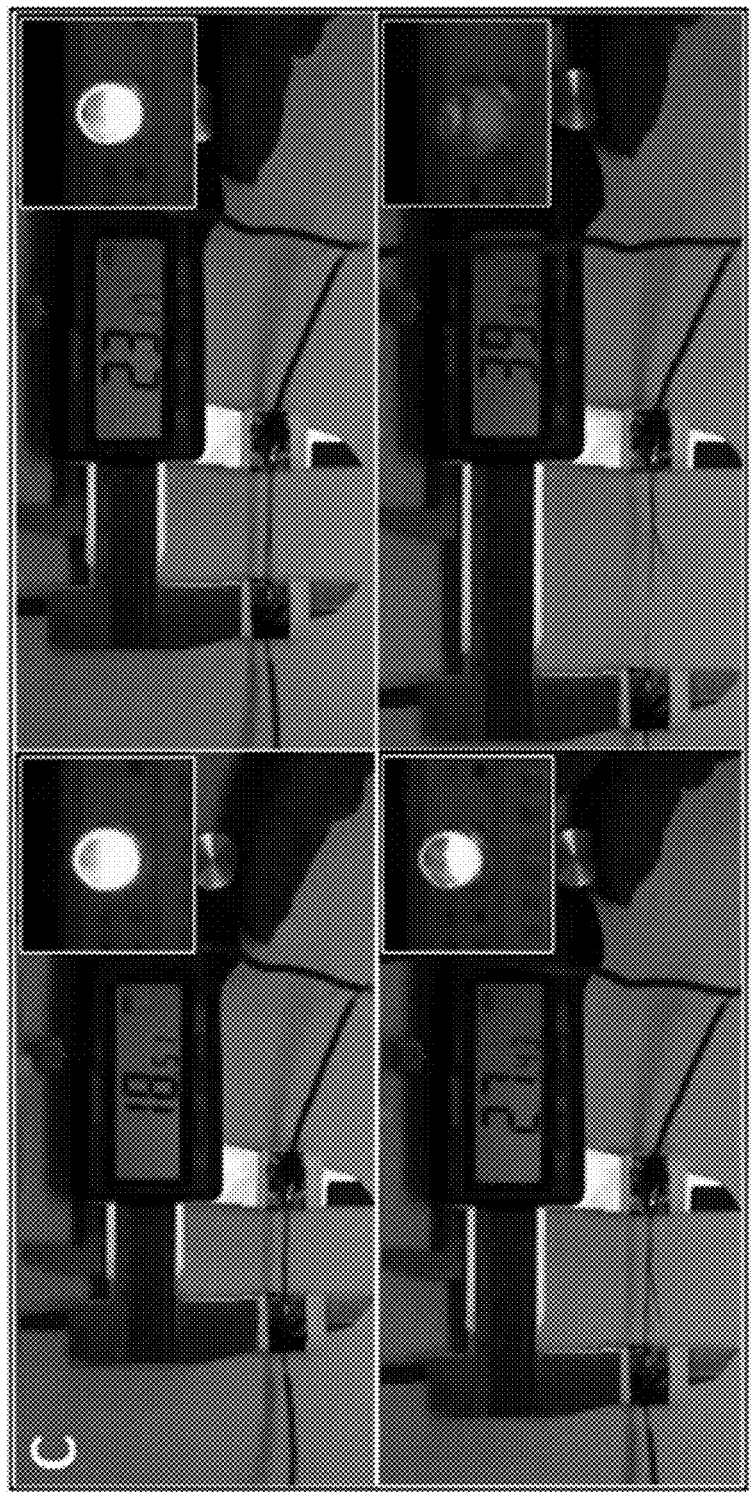
FIG. 5C shows a circuit containing a LED bulb and doped DPP-C5 microfiber, showing the LED response to the microfiber stretching.

FIG. 5B shows that DPP-C5 microfibers as conducting materials function well with wrist extension and flexion and FIG. 5B further shows that the conducting microfibers were functioning well with body motions—extension and flexion of a wrist. The stretchability of these conducting fibers was quantitatively demonstrated with a circuit which is composed of a LED bulb and doped DPP-C5 microfibers as the connecting conducting microwires. FIG. 5C shows a circuit containing a LED bulb and doped DPP-C5 microfiber, showing the LED response to the microfiber stretching.

Furthermore, we tested conducting microfibers as organic electrodes in OFET devices. A heavily n-doped Si wafer with a 300 nm SiO2 surface layer (capacitance of 11 nF/cm2) was employed as the substrate with Si wafer serving as the gate electrode and SiO2 as the dielectric. The gold S/D electrodes were sputtered and patterned by photolithography technique. For the octadecyltrichlorosilane modification, the silicon wafers were first cleaned with hot piranha solution for 20 minutes. It was then washed with deionized (DI) water several times, and further subjected to sonication sequentially in DI water and acetone for 6 min each. After drying inside an oven, the silicon wafer was then put into a clean petri dish with a small drop of OTS. The dish was then covered and heated in a vacuum oven at 120° C. for 3 hours, resulting in the formation of an OTS self-assembled monolayer on the surface. The OTS modified substrates were rinsed successively with hexane, ethanol, and chloroform, and dried by nitrogen. For polymer microfiber/ribbon devices, the polymer microfiber was placed onto the channel area parallel or perpendicular to the electric field between S/D electrodes. The polymer microfiber was then pressed by another OTS-modified silicon wafer at 120° C. in glovebox to form good contact between semiconductor and electrodes. For devices with microfiber perpendicular to electric field, the channel width is 1000 µm and channel length is 10 µm. For devices with microfiber parallel to electric field, interdigital electrode style was used to increase contact area to reduce measurement error. The channel length is 50 µm and channel width is the microribbon width measured by microscope. Device characterization was carried out using Keithley 4200 in ambient environment. The field-effect mobility was calculated in the saturation regime by using the equation $IDS=(\mu W C_i/2L)(VG-VT)^2$, where IDS is the drain-source current, µ is the field-effect mobility, W is the channel width, L is the channel length, Ci is the capacitance per unit area of the gate dielectric layer, VG is the gate voltage, and VT is the threshold voltage.

Figure 5D:
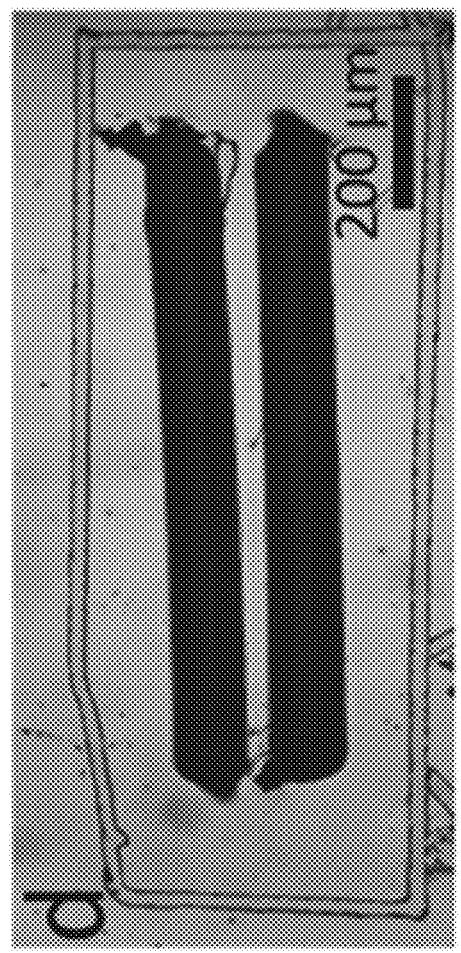
FIG. 5D shows Doped DPP-C5 microfibers serve as source/drain electrodes for an OFET.
Figure 5F:
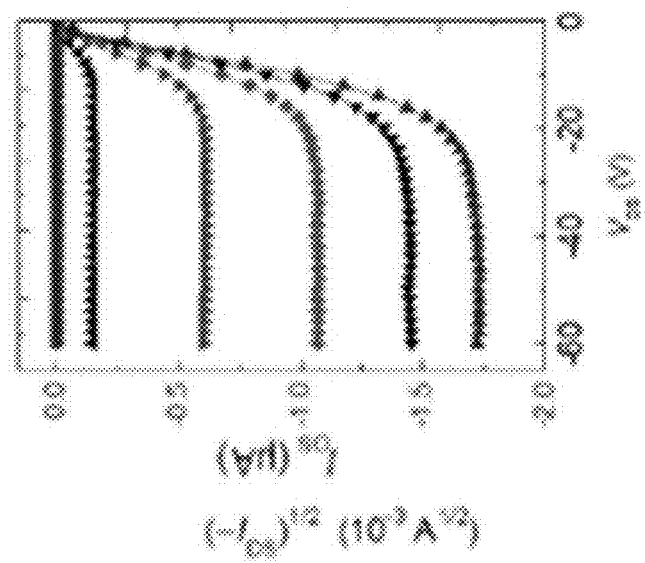
FIG. 5F shows the output curves of the OFET of FIG. 5D.
Figure 5E:
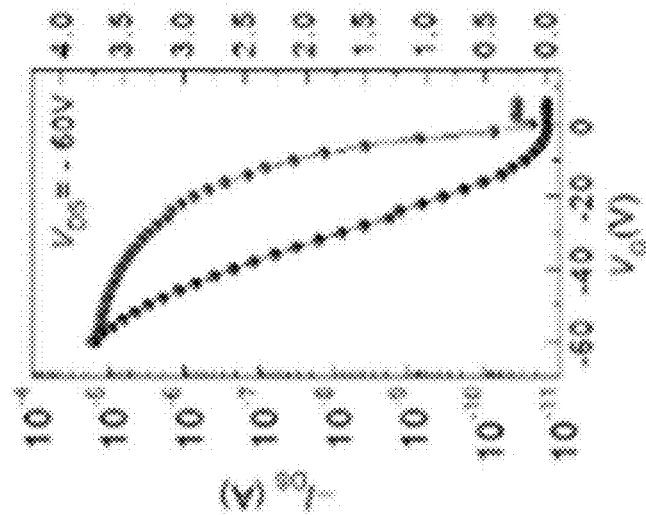
FIG. 5E shows the transfer curves of the OFET of FIG. 5D.

Two doped DPP-C5 microfibers were cut into short pieces and arranged parallel on DPP-C5/DPP-C0 blend thin film as source/drain electrodes. The octadecyltrichlorosilane (OTS)-modified 300 nm SiO2 served as dielectric layer and doped Si as gate electrode. Excellent transfer and output characteristics were obtained, and the charge carrier mobility was around 0.23 cm2/Vs. This performance is comparable to the devices with gold as source/drain electrodes. FIG. 5D shows Doped DPP-C5 microfibers serve as source/drain electrodes for an OFET. FIG. 5E and FIG. 5F show the transfer and output curves respectively of the OFET of FIG. 5D.

From the above description, it is seen that a scalable and green approach to manufacture of highly aligned semiconducting microfibers directly from polymer melts has been demonstrated. The microfibers show highly anisotropic optical and electronic properties. They are also soft and stretchable, behaving in an elastic manner under 10% strain and being stretched up to 180% without breaking. The influence of the molecular structure to mechanical property is discussed and the results show that the CBS length has a large influence on the yield point, and the side chain has more influence on the fiber elongation. These features are highly desired for future flexible, stretchable, and conformable electronics. Applications such as conducting microfibers and electrodes are demonstrated after being doped with iron chloride.

It should be recognized that in addition to the polymers referred to in the experiments described, each of the polymers indicated in 3F can be used to make microfibers by themselves or as a blend with DPP-C0. Thus, referring to FIG. 3F, microfibers of the following non-limiting example blends can be made utilizing the methods of this disclosure. DPP-C3 and DPP-C0; DPP-C7 and DPP-C0; DPP-C5-n-C12 (m=5,R=R2) and DPP-C5-Si (m=5,R=R3).

Based on the above description, it is an objective of this disclosure to describe a method of making a semi-conducting microfiber. The method includes melting a semi-conducting solid polymer material to form a polymer melt; dipping a tip of a tool such a needle into the polymer melt; lifting the tip of the tool away from a surface of the polymer melt, such that a microfiber is formed at the tip of the tool as the tip of the tool moves away from the surface of the polymer melt. A non-limiting example of a semiconducting polymer for use with this method contains DPP-C5, described in this disclosure. In some embodiments of the method, the semiconducting polymer for use with this method can be DPP-C3 or DPP-C7. In some embodiments of the method, the semiconducting polymer contains one of DPP-C3, DPP-C5 and DPP-C7 and can further contain DPP-C0. In one embodiment of the method, wherein the semiconducting polymer contains DPP-C5 and DPP-C0, a non-limiting range for the weight percentage of DPP-C5 in a mixture of DPP-C5 and DPP-C0 is 80%-100%. In some embodiments of the method, the semiconducting solid polymer can contain a dopant. The dopant contributes to make the semiconducting polymer into a conductor. A non-limiting example of such a dopant is iron chloride. Other dopants that can be used for the purpose include, but not limited to antimony pentachloride, silver perchlorate, ammonium persulfate; Tetracyanoquinodimethane (TCNQ), and iodine.

It should be recognized that it is an objective of this disclosure to describe a semi-conducting microfiber comprising a non-conjugated semiconducting polymer matrix containing crystalline aggregates with intentionally placed conjugation-break spacers along the polymer backbone. Non-limiting examples such non-conjugated semiconducting polymer matrixes include, but not limited to DPP-C3, DPP-C5, and DPP-C7.

It is another objective of this disclosure to describe a semi-conducting microfiber comprising a non-conjugated semiconducting polymer matrix containing crystalline aggregates with intentionally placed conjugation-break spacers along the polymer backbone, and a fully conjugated semiconducting polymer wherein the fully conjugated semiconducting polymer serves as tie chains to bridge crystalline aggregates from the non-conjugated polymer matrix. In some embodiments of the semiconducting fiber of this disclosure, the non-conjugated semiconducting polymer matrix containing crystalline aggregates with intentionally placed conjugation-break spacers along the polymer backbone is one of DPP-C3, DPP-C5, and DPP-C7, and the fully conjugated semiconducting polymer is DPP-C0. In some embodiments of the microfiber of this disclosure containing DPP-C5 and DPP-C0, the weight percentage of DPP-C5 can range from 80% to 99%. In some embodiments of the semiconducting fiber of this disclosure, the non-conjugated semiconducting polymer matrix containing crystalline aggregates with intentionally placed conjugation-break spacers along the polymer backbone is DPP-C3 or DPP-C7 and the fully conjugated semiconducting polymer is DPP-C0. In some embodiments of the semiconducting microfiber, the semiconducting microfiber contains a dopant. A non-limiting example of such a dopant is iron chloride. Other dopants that can be used for the purpose include, but not limited to antimony pentachloride, silver perchlorate, ammonium persulfate; Tetracyanoquinodimethane (TCNQ), and iodine.

It should be recognized that it is yet another objective of this disclosure to describe a device comprising a plurality of semi-conducting microfibers wherein each microfiber contains a non-conjugated semiconducting polymer matrix containing crystalline aggregates with intentionally placed conjugation-break spacers along the polymer backbone. Non-limiting examples such non-conjugated semiconducting polymer matrixes include, but not limited to DPP-C3, DPP-C5, and DPP-C7.

It is yet another objective of this disclosure to describe a device comprising a plurality of semiconducting microfibers, wherein each semi-conducting microfiber comprises a non-conjugated semiconducting polymer matrix containing crystalline aggregates with intentionally placed conjugation-break spacers along the polymer backbone, and a fully conjugated semiconducting polymer wherein the fully conjugated semiconducting polymer serves as tie chains to bridge crystalline aggregates from the non-conjugated polymer matrix. In some embodiments of the device of this disclosure, the non-conjugated semiconducting polymer matrix containing crystalline aggregates with intentionally placed conjugation-break spacers along the polymer backbone is one of DPP-C3, DPP-C5 and DPP-C7, and the fully conjugated semiconducting polymer is DPP-C0. In some embodiments of the device of this disclosure comprising a plurality of semiconducting microfibers containing DPP-C5 and DPP-C0, the weight percentage of DPP-C5 can range from 80% to 99%. In some embodiments of the device of this disclosure comprising a plurality of semiconducting microfibers, the non-conjugated semiconducting polymer matrix containing crystalline aggregates with intentionally placed conjugation-break spacers along the polymer backbone is DPP-C3 or DPP-C7 and the fully conjugated semiconducting polymer is DPP-C0. In some embodiments of the device of this disclosure comprising a plurality of semiconducting microfibers semiconducting microfiber, the semiconducting microfiber contains a dopant. A non-limiting example of such a dopant is iron chloride. Other dopants that can be used for the purpose include, but not limited to antimony pentachloride, silver perchlorate, ammonium persulfate; Tetracyanoquinodimethane (TCNQ), and iodine. In some embodiments of the device of this disclosure comprising a plurality of semiconducting microfibers, the device is an optoelectronics device. In some embodiments of the device of this disclosure comprising a plurality of semiconducting microfibers, the device is a sensor such as, but not limited to, a chemical sensor or a biological sensor.

It is another objective of this disclosure to describe an apparatus to make a semiconducting microfiber. The apparatus comprises a container capable of melting a polymer forming a polymer melt and holding the polymer melt in a desired temperature range; a tool that can be dipped into the melt and a means of lifting tip of the tool away from a surface of the polymer melt forming a microfiber as the tip of the tool moves away from the surface of the polymer melt. In some embodiments of the apparatus the tool is a needle, which is a non-limiting example of such a tool.

In some embodiments of the apparatus, the diameter of the needle is defined by the gauge of the needle used. A non-limiting range for the gauge of the needle is 20-50.

Those skilled in the art will recognize that numerous modifications can be made to the specific implementations described above. The implementations should not be limited to the particular limitations described. Other implementations may be possible.

The invention claimed is:

1. A method of making a semi-conducting microfiber, the method comprising:
   melting a semi-conducting solid polymer material to form a polymer melt;
   dipping a tip of a needle into the polymer melt; and
   lifting the tip of the needle away from a surface of the polymer melt,
   wherein a microfiber is formed at the tip of the needle as the tip of the needle moves away from the surface of the polymer melt.

2. The method of claim 1, wherein the semiconducting polymer comprises DPP-C5.

3. The method of claim 1, wherein the semiconducting polymer comprises DPP-C3 or DPP-C7.

4. The method of claim 1, wherein the semiconducting polymer comprises DPP-C5 and DPP-C0.

5. The method of claim 4, wherein weight percentage of DPP-C5 in a mixture of DPP-C5 and DPP-C0 is in the range of 80%-100%.

6. The method of claim 1, wherein the semiconducting solid polymer comprises a dopant.

7. The method of claim 6, wherein the dopant is iron chloride.

8. A semiconducting microfiber comprising a non-conjugated semiconducting polymer matrix containing crystalline aggregates with intentionally placed conjugation-break spacers along the polymer backbone.

9. The semiconducting microfiber of claim 8, wherein the non-conjugated semiconducting polymer matrix containing crystalline aggregates with intentionally placed conjugation-break spacers along the polymer backbone comprises one of DPP-C3, DPP-C5, and DPP-C7.

10. The semiconducting microfiber of claim 8, further comprising a fully conjugated semiconducting polymer wherein the fully conjugated semiconducting polymer serves as tie chains to bridge crystalline aggregates from the non-conjugated polymer matrix.

11. The semiconducting microfiber of claim 10, wherein the non-conjugated semiconducting polymer matrix containing crystalline aggregates with intentionally placed conjugation-break spacers along the polymer backbone comprises one of DPP-C3, DPP-C5, and DPP-C7, and the fully conjugated semiconducting polymer wherein the fully conjugated semiconducting polymer serves as tie chains to bridge crystalline aggregates from the non-conjugated polymer matrix is DPP-C0.

12. The semiconducting microfiber of claim 10, wherein the non-conjugated semiconducting polymer matrix containing crystalline aggregates with intentionally placed conjugation-break spacers along the polymer backbone is DPP-C5 and the fully conjugated semiconducting polymer wherein the fully conjugated semiconducting polymer serves as tie chains to bridge crystalline aggregates from the non-conjugated polymer matrix is DPP-C0.

13. The semiconducting microfiber of claim 12, wherein weight percentage of DPP-C5 in a mixture of DPP-C5 and DPP-C0 is in the range of 80%-99%.

14. The semiconducting microfiber of claim 8, further comprising a dopant.

15. The semiconducting microfiber of claim 14, the dopant is iron chloride.

16. A device comprising a plurality of semiconducting microfibers, wherein each microfiber comprises a non-conjugated semiconducting polymer matrix containing crystalline aggregates with intentionally placed conjugation-break spacers along the polymer backbone.

17. The device of claim 16, wherein the each microfiber comprises a non-conjugated semiconducting polymer matrix containing crystalline aggregates with intentionally placed conjugation-break spacers along the polymer backbone further contains a fully conjugated semiconducting polymer, wherein the fully conjugated semiconducting polymer serves as tie chains to bridge crystalline aggregates from the non-conjugated polymer matrix.

18. The device of claim 17, wherein the non-conjugated semiconducting polymer matrix containing crystalline aggregates with intentionally placed conjugation-break spacers along the polymer backbone is DPP-C5 and the fully conjugated semiconducting polymer, wherein the fully conjugated semiconducting polymer serves as tie chains to bridge crystalline aggregates from the non-conjugated polymer matrix is DPP-C0.

19. The device of claim 18, wherein weight percentage of DPP-C5 in a mixture of DPP-C5 and DPP-C0 is in the range of 80%-99%.

20. The device of claim 16, wherein the device is an optoelectronics device.

21. The device of claim 20, wherein the device is a sensor.

22. The sensor of claim 21, wherein the sensor is a chemical sensor.

23. The sensor of claim 21, wherein the sensor is a biological sensor.

24. An apparatus to make a semiconducting microfiber, the apparatus comprising:
   a container capable of melting a semiconducting polymer forming a semiconducting polymer melt and holding the semiconducting polymer melt in a desired temperature range;
   a tool that can be dipped into the polymer melt; and
   a means of lifting tip of the tool away from a surface of the polymer melt forming a microfiber as the tip of the tool moves away from the surface of the polymer melt.

25. The apparatus of claim 24, wherein the tool is a needle.

26. The apparatus of claim 25, wherein the gauge of the needle is in the range of 20-50.

* * * * *